United States Patent [19]
Redfield et al.

[11] Patent Number: 5,477,347
[45] Date of Patent: Dec. 19, 1995

[54] METHOD AND APPARATUS FOR ISOLATING DATA STORAGE REGIONS IN A THIN HOLOGRAPHIC STORAGE MEDIA

[75] Inventors: Stephen R. Redfield; Gerald R. Willenbring, both of Austin, Tex.

[73] Assignee: Tamarack Storage Devices, Austin, Tex.

[21] Appl. No.: 91,620

[22] Filed: Jul. 14, 1993

[51] Int. Cl.$^6$ .............. G02B 5/32; G03H 1/26; G11B 7/00
[52] U.S. Cl. .................. 359/3; 359/22; 359/25; 369/94; 369/103
[58] Field of Search ............... 359/3, 22, 24, 359/25; 369/103, 94

[56] References Cited

U.S. PATENT DOCUMENTS

| | | | |
|---|---|---|---|
| 3,560,210 | 2/1971 | Grobin, Jr. | 359/24 |
| 3,703,137 | 11/1972 | Anderson et al. | 359/25 |
| 3,706,080 | 12/1972 | Lee | 359/25 |
| 3,767,285 | 10/1973 | Mezrich | 359/25 |
| 3,883,216 | 5/1975 | Lee | 359/25 |
| 4,005,394 | 1/1977 | Kiemle | 359/25 |
| 4,076,370 | 2/1978 | Wako | 359/25 |
| 4,795,223 | 1/1989 | Moss | 359/24 |
| 5,007,690 | 4/1991 | Chern et al. | 369/103 |
| 5,059,776 | 10/1991 | Antes | 359/3 |
| 5,202,875 | 4/1993 | Rosen et al. | 369/94 |
| 5,282,066 | 1/1994 | Yu et al. | 359/3 |
| 5,319,629 | 6/1994 | Henshaw et al. | 369/103 |
| 5,381,401 | 1/1995 | Best et al. | 369/94 |

FOREIGN PATENT DOCUMENTS

| | | | |
|---|---|---|---|
| 54-131952 | 10/1979 | Japan | 359/3 |
| 60-83074 | 5/1985 | Japan | 359/3 |
| 2-157888 | 6/1990 | Japan | 353/3 |

OTHER PUBLICATIONS

Colburn et al, "Volume Hologram Formation in Photopolymer Materials," *Applied Optics*, vol. 10, No. 7, Jul. 1971, pp. 1636 to 1640.

*Primary Examiner*—Martin Lerner
*Attorney, Agent, or Firm*—Gregory M. Howison

[57] ABSTRACT

A holographic storage media for storing digital data in the form of an interference grating is provided which includes a substrate (48) over which a perforated opaque structure (50) is disposed. The opaque structure (50) has wells (52) disposed therein. In the wells, a photopolymer material (54) is disposed to form data storage regions (54). This is covered by a capping layer (56). The wells (52 are chemically and/or optically isolated from each other.

17 Claims, 3 Drawing Sheets

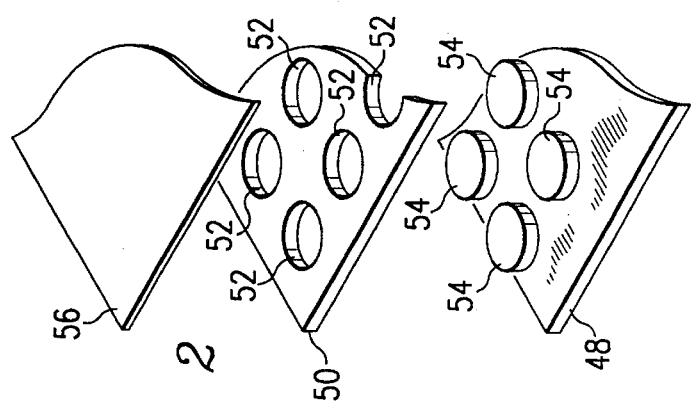
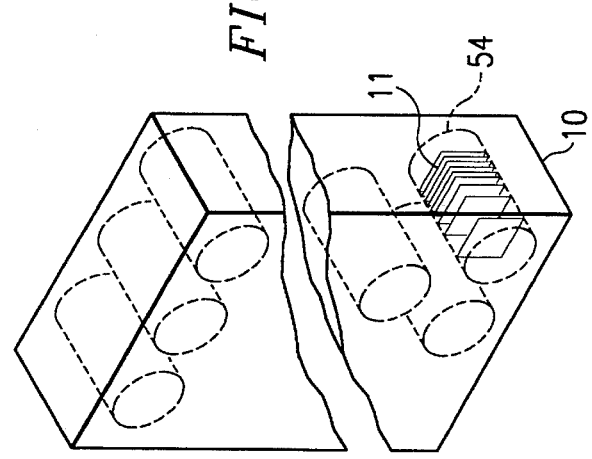
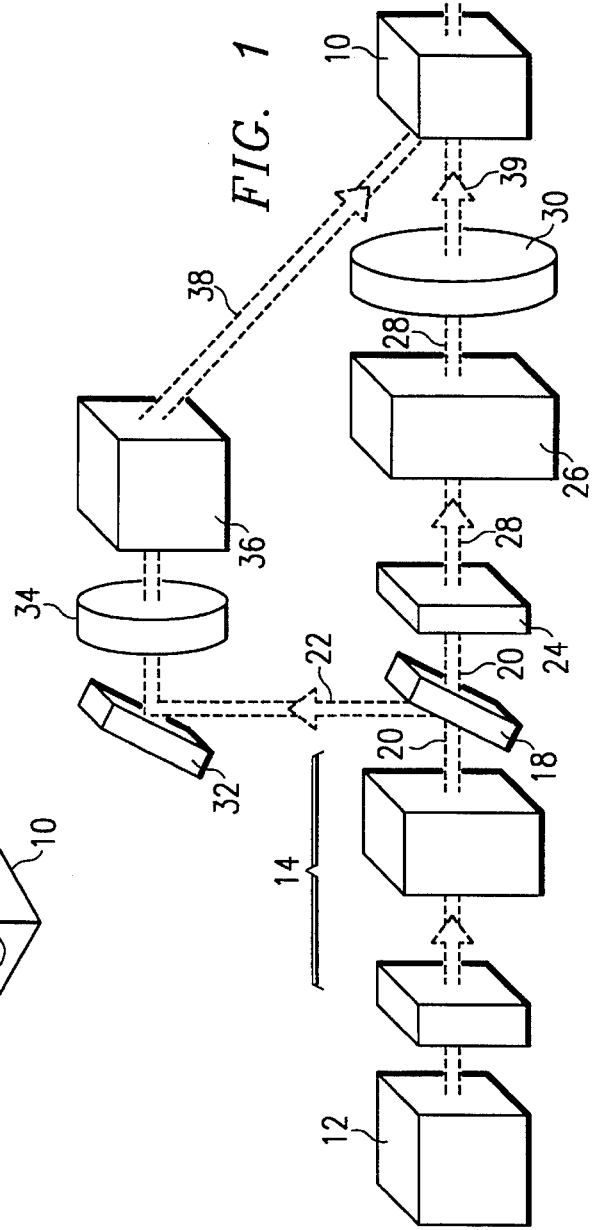

5,477,347

METHOD AND APPARATUS FOR ISOLATING DATA STORAGE REGIONS IN A THIN HOLOGRAPHIC STORAGE MEDIA

TECHNICAL FIELD OF THE INVENTION

The present invention pertains in general to holographic memories and, more particularly, to the storage media and the technique for increasing the density of storage regions on the storage media.

CROSS REFERENCE TO RELATED APPLICATIONS

This Application is related to U.S. patent application Ser. No. 091,311 now U.S. Pat. No. 5,377,176 issued Dec. 27, 1994, filed concurrent herewith, and entitled "Method and Apparatus for Phase Encoding Data Storage Regions in a Thick Holographic Storage Media" (Atty. Dkt. No. TAMA-21,889).

BACKGROUND OF THE INVENTION

As the need for increased data storage changes, the search for higher density, faster access memory technologies also increases. One of these, holographic data storage, provides the promise for increased access to higher density data. The techniques for realizing such storage typically utilize some type of storage media, such as photorefractive crystals or photopolymer layers, to store 3-D "stacks" of data in the form of pages of data. Typically, coherent light beams from lasers are utilized to perform the addressing, writing and reading of the data from the storage media by directing these beams at a specific region on the surface of the media. Writing is achieved by remembering the interference pattern formed by these beams at this region. Reading is achieved by detecting a reconstructed light beam as it exits the storage medium, the data then being extracted therefrom. Addressing is achieved by the positioning of the laser beams, and this is typically done through the mechanical movement of mirrors or lenses; however, the storage media itself can be moved relative to fixed laser beams.

One of the limiting aspects to the density of storage in the storage media is the physical separation between storage areas. A storage area or region is typically defined by the intersecting diameters of two beams. When these beams impinge upon a given area, the data is stored within the intersecting or overlapping area of the two beams and contained within the underlying structure of the media. The useful recording portion of the media is therefore confined to the overlap area. However, in actuality, parts of each beam will spread out beyond the overlap area. This will expose the media with useless information. Further, the overlap area may contain too much information and could be made smaller, such that it may be desirable to clip or aperture the overlap area. Therefore, some type of guard ring or region is desirable between storage regions.

Another aspect to be considered when dealing with adjacent regions in media such as photopolymer materials, is the diffusion of monomers within the media. Whenever one region is subjected to a Write operation, there will be some migration of monomers in the material, this being necessary to obtain contrast in the recording. Ideally, it would be desirable to locally confine this migration to the area of the recording. However, since the material is relatively homogenous and all regions are contiguous, migration of monomers can occur between recording regions.

SUMMARY OF THE INVENTION

The present invention disclosed and claimed herein discloses a holographic data storage media. The data storage media comprises a support structure on which a plurality of holographic storage regions are formed. Each of the storage regions has an incident face for receiving reference and data laser beams for Read/Write operations in the storage regions. Further, each of the storage regions is fabricated from a photo or light sensitive material that is operable to store pages of data in the form of interference gratings. An isolation structure is provided for optically isolating select ones of the storage regions from each other.

In another aspect of the present invention, the storage regions are fabricated from a photosensitive photopolymer material. The support structure comprises a planar substrate or a parallel pair of planar substrates that are optically transmissive. The isolation structure comprises a matrix of optically isolating structures disposed on the surface of the support structure. In one embodiment, the isolation structure comprises a layer of material in which wells are formed that extend through the layer. The wells define the bounds of the storage regions and contain the photopolymer material of the storage regions. In the case of a single planar substrate support structure, a capping layer is disposed over the surface proximate to the incident face of the storage regions, wherein the support structure substrate is disposed proximate to the diametrically opposite face thereof.

In a further aspect of the present invention, the support structure is comprised of a plurality of pre-polymerized regions of the photopolymer material. The pre-polymerized regions are in a substantially complete polymerized state compared with the storage regions, which are at a polymerized state consistent with the data stored therein. The pre-polymerized regions form boundaries for each of the storage regions and prevent migration between the storage regions and also provide optical isolation therebetween. Further, the pre-polymerized regions and the storage regions are fabricated from a common layer of photopolymer material.

BRIEF DESCRIPTION OF THE DRAWINGS

For a more complete understanding of the present invention and the advantages thereof, reference is now made to the following description taken in conjunction with the accompanying Drawings in which:

FIG. 1 illustrates an overall block diagram of a holographic storage assembly;

FIG. 1a illustrates a detail of the recording media;

FIG. 2 illustrates an exploded view of one embodiment of the present invention illustrating the perforated structure that forms the isolation structure in which photopolymer material is disposed, the perforations defining the recording regions;

DETAILED DESCRIPTION OF THE INVENTION

Figure 3:
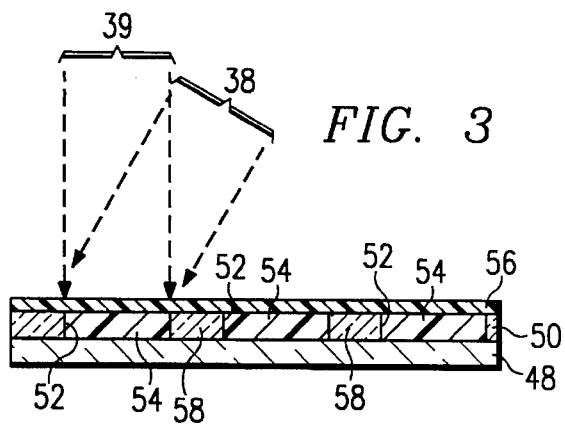
FIG. 3 illustrates a cross-sectional view of the structure of FIG. 2 after assembly thereof and with a data beam and a reference beam impinging on the surface thereof.

Referring now to FIG. 1, there is illustrated a holographic storage assembly which is operable to store data in a transparent holographic storage recording media 10 and extract that data therefrom. The data is organized in the recording media as an array of stacks of pages 11 (images). This is illustrated in FIG. 1a, wherein each of the stacks of pages 11 occupies a small region 54 of the recording media 10, with each of the pages in each of the regions 54 comprising an interference grating, all of the interference gratings in a given region 54 superimposed over each other. A laser 12 is provided, which can be comprised of, for example, a diode-pumped YAG (yttrium aluminum garnet) laser with a power output of around 80 milliwatts, with a wavelength in the range of 532 nanometers. The output beam of the laser is processed by a stack-selector assembly 14 which steers the beam to the location of an individual stack of pages 11 in the recording media 10. The output of the stack selector assembly 14 is then passed to a beam splitter 18 which separates the beam into two beams, a data beam 20 and a reference beam 22.

The data beam 20 is expanded by a beam expander 24 which is then input to a Spatial Light Modulator (SLM) 26 to output an expanded data beam 28. The SLM 26 receives data from a computer system (not shown) and then this data is superimposed on the expanded data beam 28 by the SLM 26, creating a bit pattern of light and dark spots in the conventional manner. This pattern of spots represents the bits on the page to be stored. After the SLM 26, the data beam is then passed through a focusing system 30 which then focuses the beam onto a select portion of the surface of the holographic storage media 10. This focused data beam 39 is the Fourier transform of the pattern of spots, or page.

The reference beam 22 is reflected from a mirror 32 and then passed through a polarization rotator 34, the polarization orientation dictated by an external control signal. This rotator is utilized to adjust the polarization of the reference beam 22 during a read operation. The output of the polarization rotator 34 is then input to a page addressing deflector system 36 system which defines the angle at which the reference beam will impinge the surface of the recording media 10 and also the location thereof on the surface of the recording media 10. This is represented by a deflected reference beam 38.

As the two beams, the data beam and the reference beam, enter the recording media 10, the reference beam interferes with the data beam, writing an interference grating in the storage media 10. In the case of a photorefractive material, the grating pattern results from a stored electronic-charge pattern that modifies the optical properties of the crystallite. In the case of photopolymer material, certain areas of the photopolymer material are polymerized to form the interference grating. The result is a 3-D holographic image of the Fourier transform of the bit pattern carried in the data beam. This stored interference grating allows the original data beam to be recreated when the system reads the data. This process on which the interference grating is formed on the recording media 10 is basically the Write process for a holographic storage material.

The Write process is repeated a number of times, with the angle of the reference beam operable to be changed each time, to record a plurality of interference gratings. Each of the interference gratings is associated with a different input bit pattern, which interference gratings are superimposed over each other. This collection of superimposed recordings is called a stack. The recordings that comprise each of the stacks are angularly multiplexed within each of the stacks.

During a Read cycle, the data beam is shut off so that only the deflected reference beam 38 is input to the storage media 10 at the appropriate angle and location. The angle is determined by the desired page in that particular stack. The deflected reference beam 38 will be constructively diffracted by the interference grating that was recorded with a particular underlying spatial frequency that corresponds to the deflected reference beams particular angle. This results in a reconstructed image of the original bit pattern that stored there with a reference beam with that particular angle. The diffracted reference beam 39 or reconstructed data beam then passes through the storage media 10 into a focusing system 40 which focuses the reconstructed image onto the surface of a detector array 42 of, for example, a charge-coupled device that captures the reconstructed light and dark bit patterns of the image and then convert them back to digital electronic signals for transfer to a computer. This is represented by a data output line 44.

Referring now to FIG. 2, there is illustrated an exploded view of one embodiment of the storage media 10. The storage media of FIG. 2 utilizes a photopolymer, which photopolymer is a material that undergoes photo-induced polymerization. These compositions have been used to form conventional holograms. These are typically fabricated from a viscous or gelatin-like composition which is photo-reactive. When two laser beams intersect in this composition to set up an interference pattern, this causes selective polymerization within the material. These compositions typically contain a polymeric binder, a liquid ethylinically unsaturated monomer and a photoinitiator system. Typically, the layer of viscous or gelatin-like recording material is spun or web coated onto a substrate such as glass to provide a thin coating of approximately 20 microns. A capping layer of material such as Mylar® is then disposed over the gelatin layer. This provides a relatively good optical surface on the upper surface of the gelatin layer, and the glass substrate provides a high quality optical surface on the bottom surface of the gelatin-like recording layer.

Returning to FIG. 2, an optically transmissive substrate 48 is provided over which an optically isolating perforated structural member 50 is disposed. The structural member 50 has a plurality of defined openings or wells 52 disposed therein, which wells 52 contain data storage regions 54. Each of the data storage regions 54 is separated from the other data storage region 54 by a predetermined distance. The structural member 50 is fabricated from a non-polymerizable material which is approximately 20 microns thick. In the preferred embodiment, the wells 52 are circular regions which are approximately equal to the diameter of the laser beam that impinges on the surface when reading or writing data to the storage media. The wells 52 are each operable to receive a storage area 54 of photopolymer material. An upper capping layer of Mylar® 56 is provided.

Referring now to FIG. 3, there is illustrated a cross-sectional diagram of the assembled structure of FIG. 2. It can be seen that each of the wells 52 is arranged to hold photopolymer material that forms the data storage regions 54. The photopolymer material is therefore confined within the wells 52 and separated from adjacent storage regions 54 by the portion of the structure 50 that separates the wells 52. This is represented by the space 58 between each of the photopolymer material storage regions 54. When the data beam 39 and reference beam 38 are properly adjusted, they will impinge upon the surface and be aligned with respect to the surface of a select one of the photopolymer storage regions 54. This results in a number of benefits. First, the light is confined within the regions, since the index of refraction of the structure 50 and the photopolymer material in the isolated storage regions 54 is different. Second, since the isolated regions 54 are not in contact, monomer diffusion between regions is reduced. Thirdly, an increased structural rigidity is provided for a given region 54 such that a thicker layer of photopolymer can be accommodated. In general, with a large monolithic surface area layer, the thickness of the photopolymer must be limited due to the instability of the material, since it is in a gelatin state. However, the spacers 58 provide isolation and reduce the fluid motion of the polymer to accommodate a thicker layer, it being noted that the photopolymer material is a viscous material.

Figure 3A:
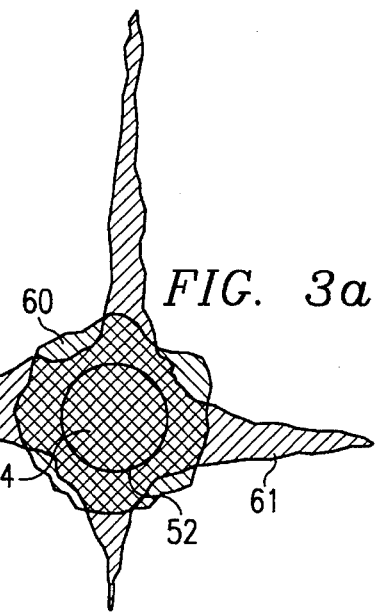
FIG. 3a illustrates a top view of one of the regions showing the spread of the beams beyond the overlapping record region.

Referring now to FIG. 3a, there is illustrated a top view of one of the isolated storage regions 54. Although illustrated as a perfect cylindrical beam in FIG. 3, the data beam 39 and reference beam 38 are not perfect cylinders. Rather, the light energy is distributed in an uneven pattern across each of the data and reference beams. The reference beam is typically round and the other, the data beam, representing a transform, which for the typical data patterns stored in the recording media being somewhat star shaped. This results in "bleed areas" 60 and 61 that exist outside of the isolated storage region 54 and the perimeter of the well 52. For relatively thick media, this can result in light scattering in other regions 54 and corrupting the data therein and wasting the recording dynamic range of the adjacent regions 54. This is especially so as the angle of incidence of the laser beam varies for addressing different pages of information. By providing the isolated storage regions 54, the scattering of light between adjacent data storage regions 54 is also minimized.

Figure 4A:
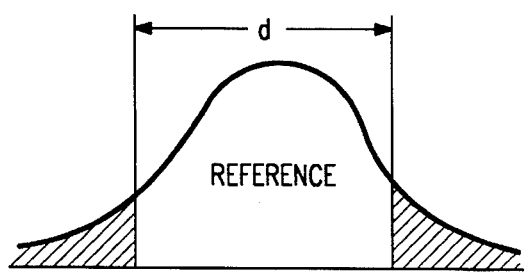
FIGS. 4a and 4b illustrate the intensity of the beams as a function of the distance across the regions.

Referring now to FIG. 4a, there is illustrated a curve representing the distribution of light energy across the beam. FIG. 4a illustrates the distribution across the reference beam 38, which distribution is generally a Gaussian distribution. It can be seen that a large part of the energy is disposed within the region having a diameter represented by "d". The portion outside of the diameter is relatively low energy and does not intersect with the data beam. However, this low energy light, although not utilized to form the interference grating in the storage region 54 or read the interference grating therefrom, can corrupt data in the other regions 54 during the Write operation, or provide extraneous noise during the Read operation.

Figure 4B:
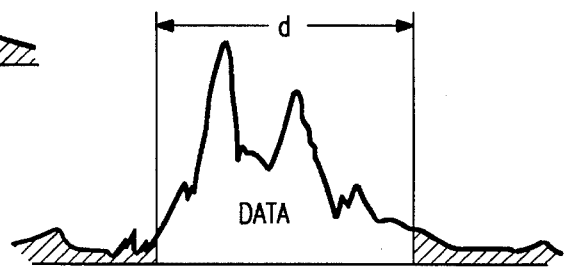

Referring now to FIG. 4b, there is illustrated a curve representing the distribution of light energy in the data beam 39. It can be seen that the distribution is more complex due to the pattern that is encoded and the transform nature of the data beam 39. However, the major portion of the light energy is disposed within the main diameter "d" of the beam and, thus, within the isolated storage region 54. Any light energy that occurs outside of the intersection of the data beam 39 and the reference beam 38 comprises the light energy in the bleed regions 60 and 61. The structure of the embodiment of FIGS. 2–3 contains the light energy and reduces the effect of this bleed region 60 on adjacent regions 54 such that the distance between regions 54 can be reduced.

Figure 5A:
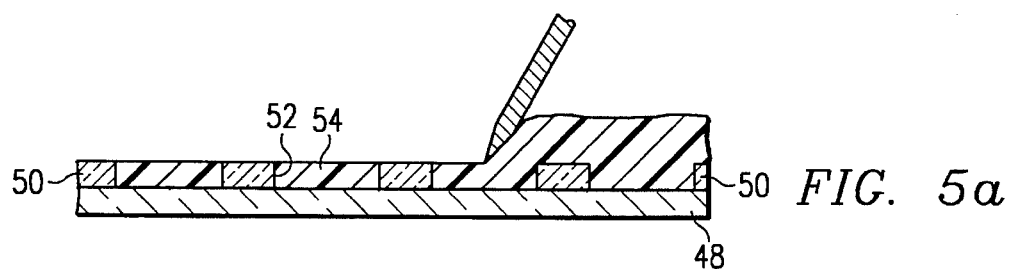
FIGS. 5a and 5b illustrate one method for forming the assembled structure illustrated in FIG. 2.
Figure 5B:
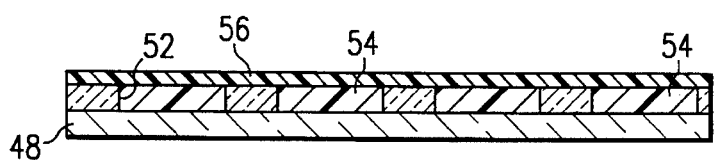

Referring now to FIGS. 5a and 5b, there is illustrated one method for forming the structures of FIG. 2 and FIG. 3. Initially, the substrate 48, which in the preferred embodiment comprises a glass substrate, has the structural member 50 with the wells 52 disposed therein attached to its upper surface. The structural member 50 is fabricated in one of multiple ways. One method for fabricating this material would be to provide an optically opaque layer of material, such as a tinted Mylar® layer or some similar plastic material, and then form the openings 52 with a laser, which would form the wells 52 therein. Further, the wells 52 could be mechanically perforated. The wells 52 have a dimension of approximately one millimeter, whereas the thickness of the structural member 50 is approximately 20 microns.

After the structural member 50 is disposed on the surface of the substrate 48, a layer of the photopolymer material in its gelatin state is disposed on the surface applied to the substrate by a "screed" operation. Alternatively, the photopolymer material could be spun onto the surface forming a conformal coat. The conformal coat would then have the upper surface thereof scraped away to have only portions of the photopolymer material spun into the wells 52. Thereafter, the capping layer 56 of Mylar® is disposed over the surface. However, any optical material that provides high quality optical properties could be utilized as the capping layer 56. The only purpose of the substrate 48 and the capping layer 56 is to provide containment by a transparent optical surface.

Figure 6:
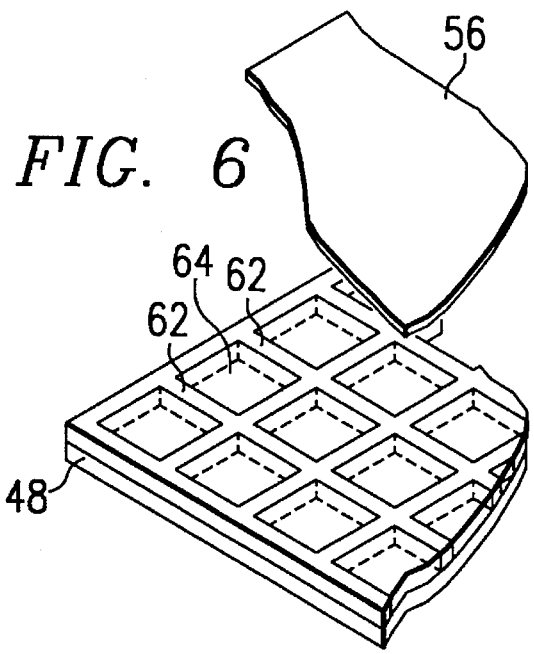
FIG. 6 illustrates an alternate embodiment of a method for isolating regions in a photopolymer storage media.

Referring now to FIG. 6, there is illustrated a second embodiment for forming isolated regions. The substrate 48 first has layer of photopolymer material disposed thereon which has isolated regions 64 defined therein by forming walls of polymerized photopolymer material 62 therebetween. The walls 62 define square isolated storage regions 64 therebetween. The walls 62 can be fabricated of a separate structural material, but in the embodiment of FIG. 6 in the preferred mode, they are formed by optically polymerizing the material, such that a slight structural advantage is provided but chemical isolation is also provided in the form of a non-polymerizable region. This impedes monomer migration between adjacent recording regions in the recording media. Since the region containing the walls 62 are polymerized, the migration of monomers between region 64 cannot occur. The capping layer 56 is then disposed on the upper surface.

Figure 7:
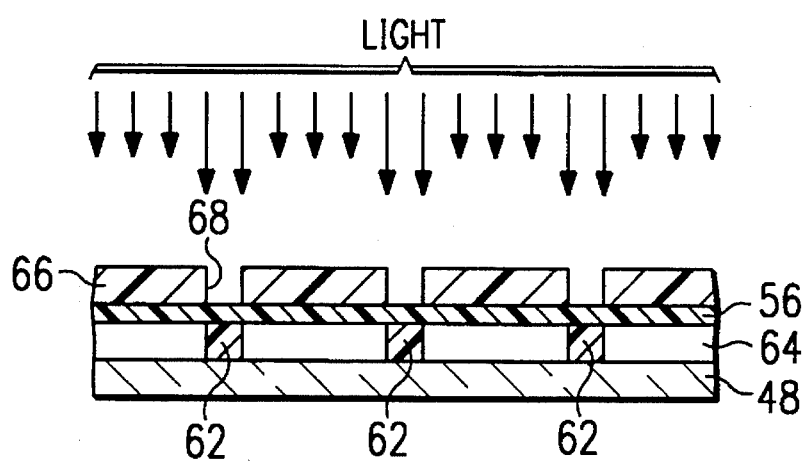
FIG. 7 illustrates a method for manufacturing the media structure of FIG. 6.

Referring now to FIG. 7, there is illustrated a cross-sectional diagram of a process utilized for forming the polymerized wall 62. A template 66, having selectively disposed holes 68 defining a pattern, is disposed on the upper surface of the capping layer 56. The upper surface of the template 66 is then exposed to saturate the storage media between the layers 48 and 56 with sufficient light to saturate that exposed portion. This will then completely polymerize the exposed portion, forming the layer 62. Although a rectangular structure is illustrated, any pattern could be formed, depending upon the pattern of the openings 68 in the template 66. The template 66 could be a mechanical template, as illustrated in FIG. 7 or it could be a photoresist layer.

In summary, there have been provided methods and apparatus for forming a holographic storage media with selected storage regions disposed thereon in an isolated manner. Regions within the storage media are physically isolated by placing barriers between the regions. In one embodiment, an opaque structure is disposed on a transparent substrate to define wells. A photopolymer material is disposed within the wells and then a capping layer disposed over the structure. The wells define the storage regions. In another technique, walls are formed within the photopolymer material by complete polymerization of select regions. This defines selected regions.

Although preferred embodiments have been described in detail, it should be understood that various changes, substitutions and alterations can be made therein without departing from the spirit and scope of the invention as defined by the appended claims.

What is claimed is:

1. A holographic data storage medium, comprising:

a support structure comprising an optically transmissive planar substrate;

a plurality of holographic storage regions formed on said support structure, said storage regions formed from a photosensitive photopolymer material, each of said storage regions having an incident face for receiving reference and data laser beams for the Read/Write operation within said storage region and a diametrically opposed face disposed proximate to said planar substrate and for allowing said reference and data laser beams to exit said storage region, each of said storage regions fabricated from a material that is operable to store pages of data in the form of interference gratings; and a matrix wells formed in a planar isolating layer, which said isolating layer is disposed on the surface of said substrate, each of said wells extending through said isolating layer and for containing said holographic storage regions and for isolating select ones of said storage regions from each other.

2. The data storage media of claim 1, wherein the portion of said isolating layer between each of said wells is operable to optically isolate said select ones of said storage regions from each other.

3. The data storage media of claim 1, and further comprising an optically transmissive capping layer for being disposed on the surface of said isolating layer diametrically opposite said planar substrate, said capping layer for containing said photopolymer material.

4. The data storage media of claim 1, wherein the portion of said planar isolating layer between said wells comprises non polymerizable regions of said photopolymer material, wherein said non-polymerizable regions are at a substantially complete polymerized state, with said storage regions being polymerized to a level consistent with the data stored therein.

5. The data storage media of claim 4, and further comprising an optically transmissive capping layer for being disposed on the surface of said non polymerizable regions and said storage regions proximate to said incident face of said storage regions for containing said photopolymer material of said storage regions.

6. The data storage media of claim 4, wherein said storage regions and said non polymerizable regions are formed from a common layer of photopolymer material.

7. The data storage means of claim 1, wherein said material from which said holographic storage regions are formed comprises a viscous gel material.

8. The data storage media of claim 1, wherein the portion of said planar isolating layer between said wells has an index of refraction relative to said storage regions that will cause internal reflections to occur in said storage regions.

9. The data storage media of claim 1, wherein the portion of said isolation layer between said wells is operable to chemically isolate said select ones of said storage regions from each other.

10. A holographic data storage system, comprising:

a coherent light source;

a beam splitter for splitting the light beam output by said light source into a data beam and a reference beam;

a write device for encoding data onto said data beam;

a steering device for directing said reference beam to intersect said data beam and cause an interference grating at said intersection;

a holographic storage medium having a recording surface disposed at the plane of said intersection of said reference and data beams; lo said steering device operable to steer said intersection to a select location on the surface of said storage medium; and said holographic storage medium comprising:

a support structure comprising an optically transmissive planar substrate, a plurality of holographic storage regions formed on said support structure, said storage regions formed from a photosensitive photopolymer material, each of said storage regions having an incident face for receiving reference and data laser beams for the Read/Write operation within said storage region and a diametrically opposed face disposed proximate to said planar substrate and for allowing said reference and data laser beams to exit said storage region, each of said storage regions fabricated from the material that is operable to store pages of data in the form of interference gratings, and a matrix of wells formed in a planar isolating layer, which said isolating layer is disposed on the surface of said substrate, each of said wells extending through said isolating layer and for containing said holographic storage regions and for isolating select ones of said storage regions from each other.

11. The data storage system of claim 10, wherein the portion of said planar isolating layer between said wells comprises a plurality of non-polymerizable regions of said photopolymer material, wherein said non-polymerizable regions are at a substantially complete polymerized state, with said storage regions being polymerized to a level consistent with the data stored therein.

12. The data storage media of claim 11, and further comprising an optically transmissive capping layer for being disposed on the surface of said non-polymerizable regions and said storage regions proximate to said incident face of said storage regions for containing said photopolymer material of said storage regions.

13. A method for fabricating a holographic data storage medium, comprising the steps of:

providing a support structure comprised of an optically transmissive planar substrate;

forming a plurality of storage regions on the planar substrate, the storage regions fabricated from a photosensitive photopolymer material, each of the storage regions having an incident face for receiving reference and data laser beams for the read/write operation within the storage region and a diametrically opposite face disposed proximate to the surface of the planar substrate and allowing the reference and data streams to exit the storage region, each of the storage regions fabricated from a material that is operable to store pages of data in the form of interference grating; and isolating select ones of the storage regions from each other by forming a matrix of wells in a planar isolating layer and disposing the planar isolating layer on the surface of the planar substrate, each of the wells extending through the planar isolating layer and operable to contain the holographic storage regions, each of the wells surrounding the associated one of the holographic storage regions.

14. The method of claim 13, wherein the step of isolating comprises chemically isolating select ones of the storage regions from each other with the matrix of wells.

15. The method of claim 14, wherein the step of isolating comprises optically isolating select ones of the storage regions from each other with the matrix of wells.

16. The method of claim 13, and further comprising disposing an optically transmissive capping layer on the upper surface of the isolating layer diametrically opposite the planar substrate, the capping layer for containing the photopolymer material.

17. The method of claim 13, wherein the the portion of the isolating layer between the wells comprises non-polymerizable regions of the photopolymer material formed on the surface of the support structure, wherein the non-polymerizable regions are at a substantially complete polymerized state, with the storage regions being polymerized to a level consistent with the data stored therein.

* * * * *

UNITED STATES PATENT AND TRADEMARK OFFICE
CERTIFICATE OF CORRECTION

PATENT NO. : 5,477,347

DATED : December 19, 1995

INVENTOR(S) : Redfield, et al.

It is certified that error appears in the above-identified patent and that said Letters Patent is hereby corrected as shown below:

Column 7, Claim 1, line 19, insert --of-- following "matrix".

Column 8, Claim 10, line 5, delete "lo".

Signed and Sealed this

Fourteenth Day of May, 1996

Attest:

BRUCE LEHMAN

*Attesting Officer*   *Commissioner of Patents and Trademarks*